(12) United States Patent
Lee et al.

(10) Patent No.: US 11,646,203 B2
(45) Date of Patent: May 9, 2023

(54) THIN FILM FORMATION APPARATUS AND METHOD USING PLASMA

(71) Applicant: SAMSUNG ELECTRONICS CO., LTD., Suwon-si (KR)

(72) Inventors: Junyeong Lee, Seoul (KR); Minkyu Park, Seoul (KR); Insun Yi, Seoul (KR); Beomseok Kim, Seoul (KR); Youngseok Kim, Seoul (KR); Kuntack Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 256 days.

(21) Appl. No.: 16/925,532

(22) Filed: Jul. 10, 2020

(65) Prior Publication Data

US 2021/0210342 A1  Jul. 8, 2021

(30) Foreign Application Priority Data

Jan. 6, 2020  (KR) .................. 10-2020-0001607

(51) Int. Cl.
*H01L 21/02* (2006.01)
*H01L 29/66* (2006.01)
(Continued)

(52) U.S. Cl.
CPC ........ *H01L 21/0262* (2013.01); *C23C 16/401* (2013.01); *C23C 16/46* (2013.01);
(Continued)

(58) Field of Classification Search
CPC ........... H01L 21/0262; H01L 21/02488; H01L 21/02532; H01L 21/02592; H01L 21/02595; H01L 21/02598; H01L 21/67103; H01L 21/02126; H01L 21/02266; H01L 27/10888; H01L 27/115; H01L 27/11582; H01L 29/6681; H01L 29/42393; H01L 29/78696; C23C 16/401;
(Continued)

(56) References Cited

U.S. PATENT DOCUMENTS 5,939,831 A * 8/1999 Fong ................. H01L 21/67017
134/1.1
5,993,538 A 11/1999 Asakawa et al.
(Continued)

FOREIGN PATENT DOCUMENTS

CN  101188258 A  5/2008
CN  102373500 A  3/2012
(Continued)

*Primary Examiner* — Dale E Page
*Assistant Examiner* — Quovaunda Jefferson
(74) *Attorney, Agent, or Firm* — Volentine, Whitt & Francos, PLLC

(57) ABSTRACT

A thin film formation apparatus includes a chamber, a platen disposed within the chamber, a heater configured to heat the platen within the chamber, a gas inlet communicating with an interior of the chamber and configured to supply a reducing gas and inert gas to the interior of the chamber, a target disposed within the chamber and spatially separated from the platen, and a microwave plasma source disposed adjacent to the target. The reducing gas includes at least one of hydrogen ($H_2$) and deuterium ($D_2$).

15 Claims, 12 Drawing Sheets

(51) Int. Cl.
  *H01L 27/108* (2006.01)
  *H01L 27/115* (2017.01)
  *H01J 37/32* (2006.01)
  *C23C 16/511* (2006.01)
  *C23C 16/46* (2006.01)
  *C23C 16/40* (2006.01)

(52) U.S. Cl.
  CPC ........ *C23C 16/511* (2013.01); *H01J 37/3244* (2013.01); *H01J 37/32192* (2013.01); *H01J 37/32724* (2013.01); *H01L 21/02488* (2013.01); *H01L 21/02532* (2013.01); *H01L 27/10888* (2013.01); *H01L 27/115* (2013.01); *H01L 29/6681* (2013.01); *H01J 2237/332* (2013.01); *H01L 21/02592* (2013.01); *H01L 21/02595* (2013.01); *H01L 21/02598* (2013.01)

(58) Field of Classification Search
  CPC ... C23C 16/46; C23C 16/511; C23C 14/0057; C23C 14/024; C23C 14/10; C23C 14/16; C23C 14/541; C23C 14/06; C23C 14/3457; H01J 37/32192; H01J 37/3244; H01J 37/32724
  See application file for complete search history.

(56) References Cited

U.S. PATENT DOCUMENTS

| | | | |
|---|---|---|---|
| 6,530,997 | B1 | 3/2003 | Avanzino et al. |
| 6,789,499 | B2 | 9/2004 | Voutsas et al. |
| 8,575,608 | B2 * | 11/2013 | Sasagawa ......... H01L 29/78669 257/52 |
| 9,030,105 | B2 * | 5/2015 | Koyama ............. H01L 27/1225 345/76 |
| 2006/0121691 | A1 | 6/2006 | Noguchi et al. |
| 2008/0121278 | A1 | 5/2008 | Ito et al. |
| 2018/0204729 | A1 * | 7/2018 | Sonoda ................. H01L 21/768 |

FOREIGN PATENT DOCUMENTS

| | | |
|---|---|---|
| JP | 2001168029 A | 6/2001 |
| JP | 20020270520 A | 9/2002 |
| JP | 4250834 B2 | 1/2009 |
| JP | 2010262947 A | 11/2010 |

* cited by examiner

THIN FILM FORMATION APPARATUS AND METHOD USING PLASMA

CROSS-REFERENCE TO THE RELATED APPLICATION

A claim of priority is made to Korean Patent Application No. 10-2020-0001607, filed on Jan. 6, 2020, in the Korean Intellectual Property Office (KIPO), the disclosure of which is incorporated herein by reference in its entirety.

BACKGROUND

The exemplary embodiments of this disclosure relate to thin film formation apparatus and methods utilizing plasma.

A semiconductor device generally includes multiple material layers formed on a substrate. The substrate, however, may initially include a natural oxide layer that can interfere with the formation of such layers. As such, costly and time consuming pre-treatment processes may be needed to remove the natural oxide layer prior to formation of the material layers on the substrate. A resultant exposure of the substrate to high-temperatures may deteriorate electrical characteristics of the semiconductor device.

SUMMARY

A thin film formation apparatus according to an embodiment of the disclosure includes a chamber, a platen disposed within the chamber, a heater configured to heat the platen within the chamber, a gas inlet communicating with an interior of the chamber and configured to supply a reducing gas and inert gas to the interior of the chamber, a target disposed within the chamber and spatially separated from the platen, and a microwave plasma source disposed adjacent to the target. The reducing gas includes at least one of hydrogen ($H_2$) and deuterium ($D_2$).

A thin film formation device according to an embodiment of the disclosure includes loading a substrate having a thin film onto a platen within a chamber such that the thin film faces toward a target within the chamber, supplying a reducing gas and an inert gas into the chamber through a gas inlet of the chamber, generating plasma within the chamber using a microwave plasms source, and forming a reduced semiconductor layer in place of at least a portion of the thin film and a semiconductor layer over the reduced semiconductor layer during the generation of plasma within the chamber. The reducing gas includes at least one of hydrogen ($H_2$) and deuterium ($D_2$).

A thin film formation device according to an embodiment of the disclosure includes a thin film formation method is provided which includes loading a substrate having a thin film onto a platen within a chamber such that a surface of the substrate faces toward a target within the chamber, supplying a reducing gas and an inert gas into the chamber through a gas inlet of the chamber, generating plasma within the chamber using a microwave plasms source, and forming a semiconductor layer on the surface of the substrate during the generation of plasma within the chamber. The reducing gas includes at least one of hydrogen ($H_2$) and deuterium ($D_2$).

DETAILED DESCRIPTION OF EMBODIMENTS

Figure 1:
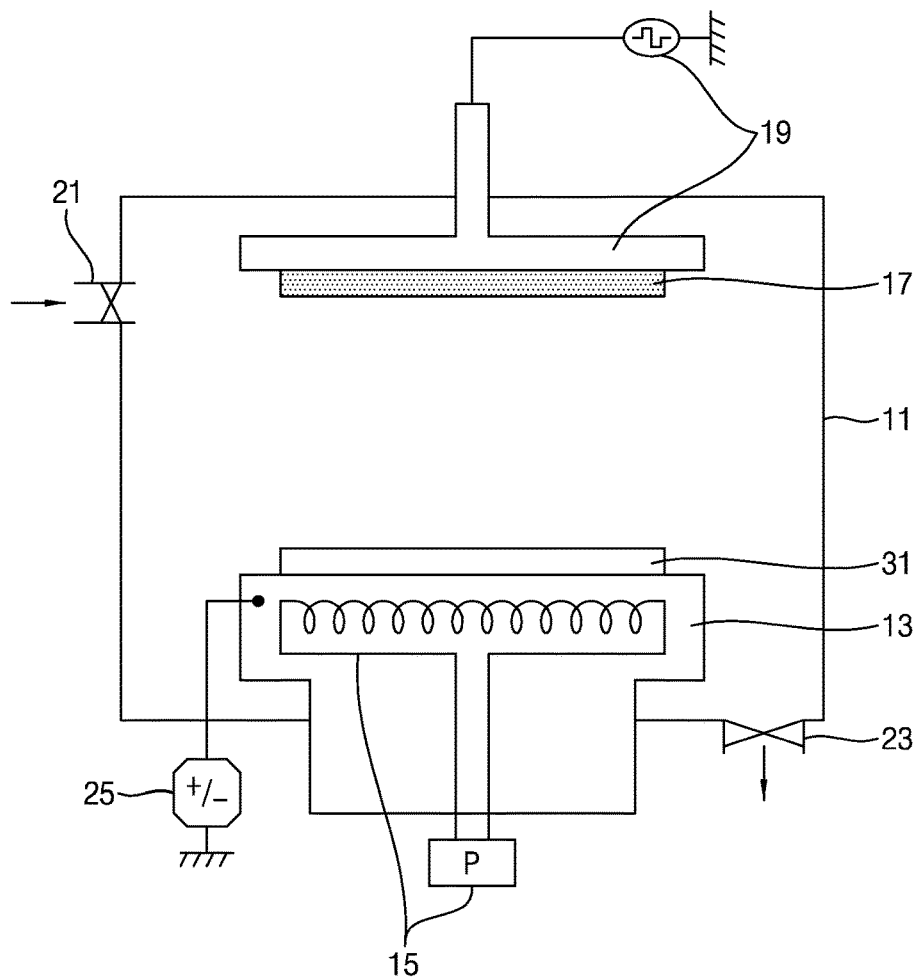
FIG. 1 is a schematic view for reference in explaining a configuration of a thin film formation apparatus according to an exemplary embodiment of the disclosure.

FIG. 1 is a schematic view for reference in explaining a configuration of a thin film formation apparatus according to an exemplary embodiment of the disclosure.

Referring to FIG. 1, the thin film formation apparatus according to this example embodiment may include a chamber 11, a platen 13, a heater 15, a target 17, a plasma source 19, a gas inlet 21, an exhaust port 23, and a bias device 25. A substrate 31 may be loaded on the platen 13.

The gas inlet 21 may communicate with an interior of the chamber 11. The gas inlet 21 may include elements not illustrated in FIG. 1, such as one or more mass flow controllers in fluid communication with storage tanks for each of respective process gases. The gas inlet 21 may function to supply a reducing gas and an inert gas to the interior of the chamber 11. As examples, the reducing gas may include hydrogen ($H_2$), deuterium ($D_2$), or a combination thereof. Also as examples, the inert gas may include argon (Ar), helium (He), neon (Ne), or a combination of two or more thereof. In an exemplary embodiment, hydrogen gas and argon (Ar) gas may be supplied to the interior of the chamber 11 through the gas inlet 21. The gas inlet 21 may include a single gas inlet for introducing a mixture of process gases into the chamber 11, or multiple gas inlets for separately introducing different process gases into the chamber 11.

The exhaust port 23 may communicate with the interior of the chamber 11. The exhaust port 23 may include elements not shown in FIG. 1, such as one or more exhaust pumps. The chamber 11 may be a vacuum chamber. The exhaust port 23 may be connected to an evacuation pump (not shown) and function to adjust an internal pressure of the chamber 11. For example, the exhaust port 23 may function to adjust the internal pressure of the chamber 11 to be in a range of 10 mTorr to 1 Torr, both inclusive. The exhaust port 23 may include a single evacuation port or multiple evacuation ports.

The platen 13 may be disposed within the chamber 11. The platen may include a mechanism (not shown) for securing a substrate (e.g., wafer) 31 to a support surface of the platen 13. As examples, the platen 13 may be equipped with an electrostatic chuck, a vacuum chuck, a mechanical chuck (e.g., a clamp), or a combination of two or more thereof.

The heater 15 may be disposed adjacent the support surface of the platen 13. For example, the heater 15 may be disposed within the platen 13 below the support surface of the platen 13. The heater 15 may function to adjust a temperature of the platen 13 and thus substrate 31. In an exemplary embodiment, the heater 15 may be configured to establish a temperature of the platen 13/substrate 31 in a range of 100 to 500° C., both inclusive. For example, the heater 15 may include an aluminum nitride (AlN) heating element coupled to a power source P.

The target 17 may be disposed within the chamber 11. The target 17 may be spatially separated from the platen 13. Assuming the orientation of FIG. 1, the target 17 may be disposed to face an upper surface of the substrate 31 when a lower surface of the substrate 31 is located on the support surface of the platen 13. The target 17 may include a semiconductor material. For example, the target 17 may include silicon oxide such as quartz.

The plasma source 19 may be disposed inside and/or outside the chamber 11 adjacent to the target 17. The plasma source 19 may include an antenna/waveguide and an electric power source, and may be a microwave plasma device. In an example embodiment, the plasma source 19 is a 2.45 GHz microwave plasma device. Electric power of 500 to 5,000 W, both inclusive, may be applied by the electric power source of the plasma source 19. The plasma source 19 may function to produce plasma. For example, when the reducing gas introduced by the gas inlet 21 includes hydrogen, the plasma may include H-radicals, $H_2$-radicals, H-ions, $H_2$-ions, or a combination of two or more thereof. In an exemplary embodiment, the semiconductor material included in the target 17 may migrate toward the substrate 31 when exposed to the plasma. For example, silicon oxide included in the target 17 may be reduced to SiOH which may, in turn, migrate toward the substrate 31.

The bias device 25 of FIG. 1 may function to adjust migration directions and speeds of reactive materials within the chamber 11. The bias device 25 may be connected to the platen 13 to bias the platen to adjust migration directions and speeds of reactive materials within the chamber 11. The bias device 25 is optional, and in an exemplary embodiment, the bias device 25 may be omitted. In this case, the platen 13 may be self-biased or grounded.

Figure 2:
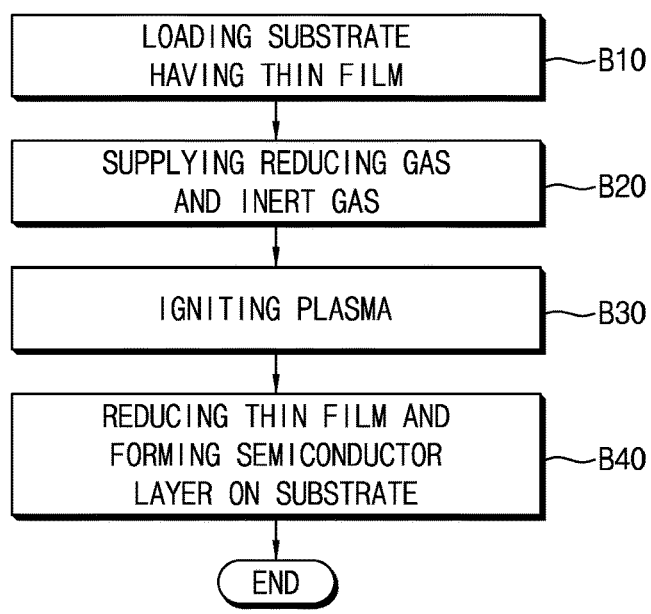
FIG. 2 is a flowchart for reference in explaining a thin film formation method according to an exemplary embodiment of the disclosure.

FIG. 2 is a flowchart for reference in explaining a thin film formation method according to an exemplary embodiment of the disclosure.

Referring to FIG. 2 the thin film formation method according to the exemplary embodiment of the disclosure may include loading a substrate (B10), supplying reducing gas and inert gas (B20), igniting plasma (B30), and reducing a thin film and forming a semiconductor layer on the substrate (B40). These processes will be discussed in detail below with additional references to FIGS. 3-10.

Figure 4:
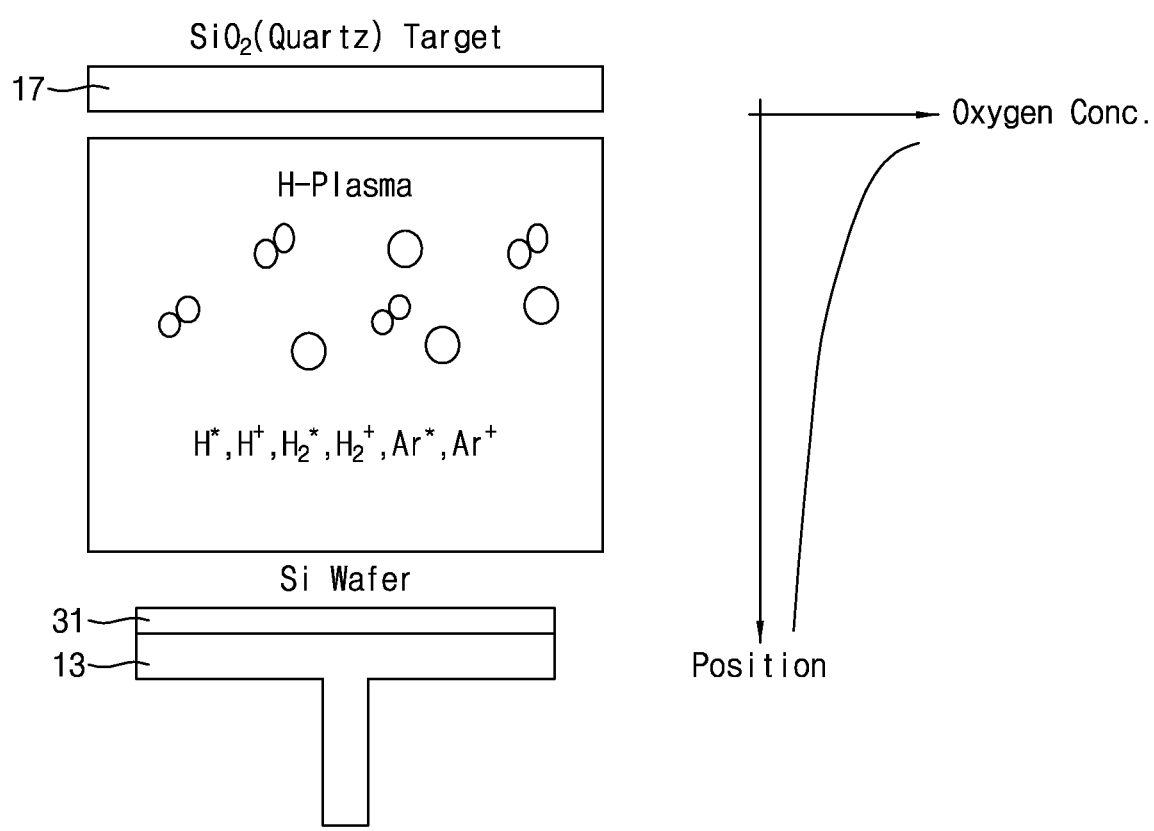
FIGS. 4 and 5 are schematic views for reference in explaining an operation of a thin film formation apparatus.
Figure 5:
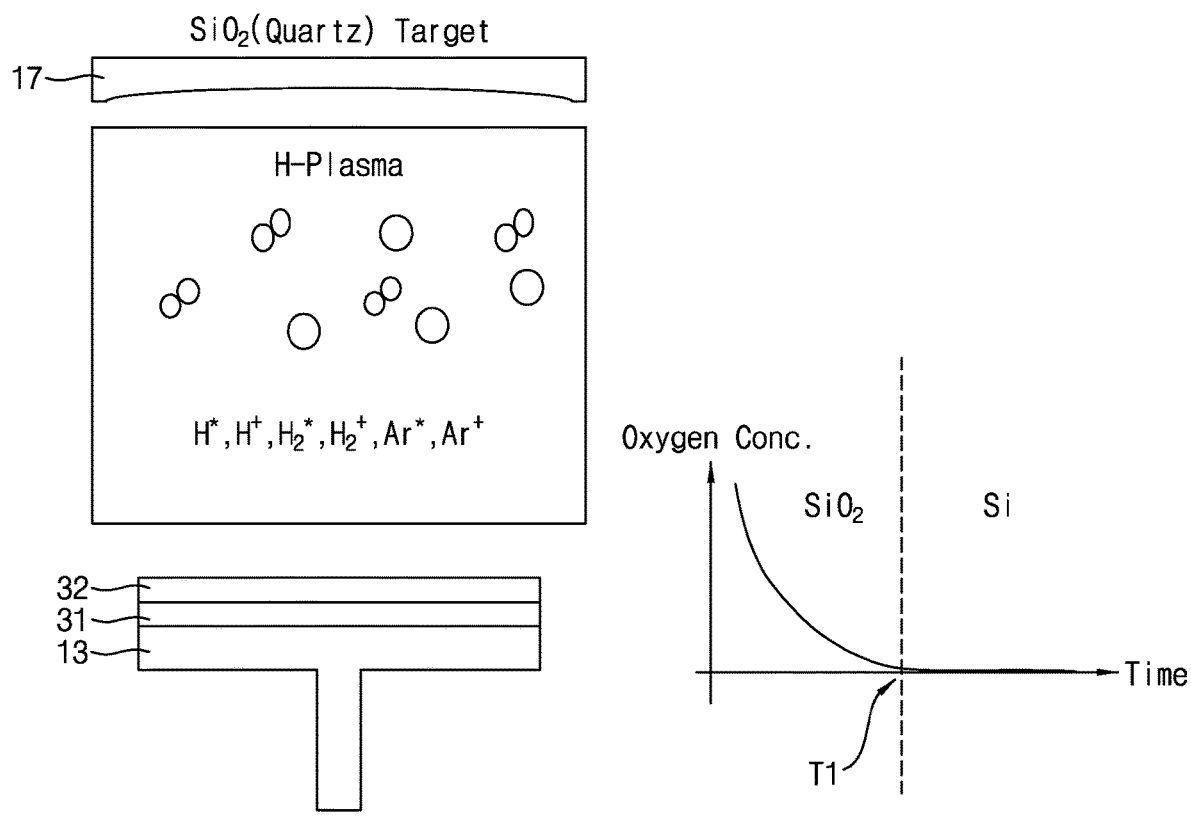

FIG. 3 and FIGS. 6 to 10 are sectional views for reference in explaining thin film formation methods according to exemplary embodiments of the disclosure. FIGS. 4 and 5 are schematic views for reference in explaining an operation of the thin film formation apparatus during the thin film formation methods according to exemplary embodiments of the disclosure.

Figure 3:
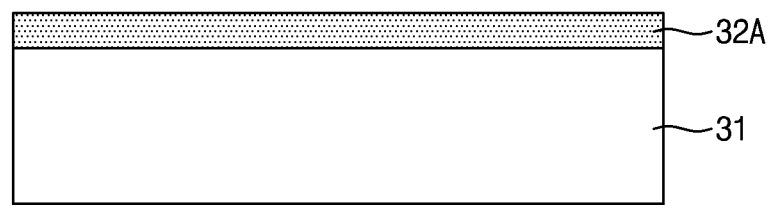
FIGS. 3 and 6 are cross-sectional views for reference in explaining a thin film formation method according to an exemplary embodiment of the disclosure.

Referring to FIGS. 1 to 3, a first thin film 32A may be present at an exposed surface of the substrate 31. The substrate 31 may be a semiconductor substrate such as a single-crystalline silicon wafer. The first thin film 32A may include Si, O, N, C, or a combination of two or more thereof. In an exemplary embodiment, the first thin film 32A may be a natural oxide layer or a silicon oxide layer having a thickness of 2 nm or less. In another exemplary embodiment, the first thin film 32A may be a silicon oxide layer having a thickness of 0.1 to 2 nm. The substrate 31 having the first thin film 32A may be loaded on the platen 13 within the chamber 11 (B10). Using the exhaust port 23, the internal pressure of the chamber 11 may be adjusted to be 10 mTorr to 1 Torr. Using the heater 15, the substrate 31 including the first thin film 32A may be heated to 100 to 500° C.

Next, a reducing gas and an inert gas may be supplied to the interior of the chamber 11 through the gas inlet 21 (B20). In an exemplary embodiment, the reducing gas may be hydrogen gas and the inert gas may be argon (Ar) gas.

Plasma may be ignited within the chamber 11 using the plasma source 19 (B30). In an exemplary embodiment, the plasma source 19 may be a 2.45 GHz microwave plasma device. Electric power of 500 to 5,000 W may be applied to the plasma source 19.

Referring to FIG. 4, H-radicals, $H_2$-radicals, H-ions, $H_2$-ions, or a combination of two or more thereof may be produced within the chamber 11. The semiconductor material included in the target 17 may migrate toward the substrate 31 after being reduced. For example, silicon oxide included in the target 17 may be reduced to SiOH which may, in turn, migrate toward the substrate 31. As represented by the graph of FIG. 4, an oxygen concentration in the interior of the chamber 11 may gradually increase toward the target 17 while gradually decreasing toward the substrate 31.

As shown in FIG. 5, a reduction process takes place in which oxygen may be removed from the first thin film 32A at the surface of the substrate 31, and at time T1 the oxygen is substantially or completely removed to define a reduced semiconductor layer 32 of silicon (Si) at the surface of the substrate 31. In this way, the first thin film layer 32A of silicon dioxide is reduced to a layer 32 of silicon.

Figure 6:
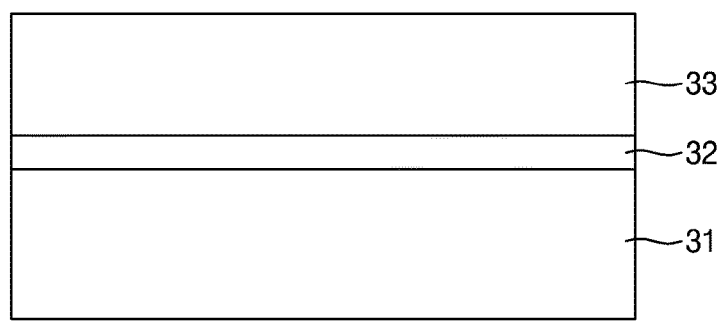

Referring additionally to FIG. 6, a semiconductor layer 33 may be formed on the reduced semiconductor layer 32 of the substrate 31 (B40).

In an exemplary embodiment, as shown in FIG. 6, an entirety of the first thin film 32A may be reduced. Accordingly, on the substrate 31, the reduced semiconductor layer 32 may be continuous with the underlying substrate 31. On the reduced semiconductor layer 32, the semiconductor layer 33 may be continuous with the reduced semiconductor layer 32. In other words, the substrate 31, the reduced semiconductor layer 32 and the semiconductor layer 33 may constitute a single-crystalline semiconductor layer such as a single-crystalline silicon layer. The semiconductor layer 33 may be thicker than the reduced semiconductor layer 32.

As described above, in exemplary embodiments of the disclosure, it may be possible to form single-crystalline semiconductor layers such as the reduced semiconductor layer 32 and the semiconductor layer 33 on the substrate 31, without carrying out a cleaning process in which the first thin film 32A is removed.

Figure 7:
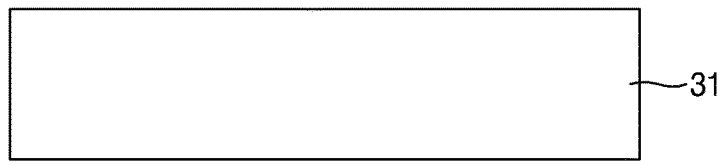
FIGS. 7 and 8 are additional cross-sectional views for reference in explaining a thin film formation method according to another exemplary embodiment of the disclosure.
Figure 8:
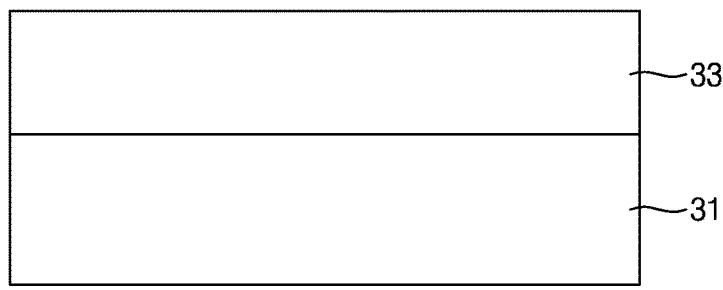

FIGS. 7 and 8 are sectional views for reference in describing another example in which no first thin film 32A is present on the substrate.

Referring to FIG. 7, a substrate 31 may be provided. The substrate 31 may include a single-crystalline semiconductor layer such as a single-crystalline silicon layer. In contrast to the embodiment of FIG. 3, no thin film is present on a surface of the substrate 31.

Referring to FIG. 8, a semiconductor layer 33 may be formed on the substrate 31 in a manner similar to the processes described with reference to FIGS. 1 to 6, except that there is no reduction of a thin film. On the substrate 31, the semiconductor layer 33 may be continuous with the substrate 31. The semiconductor layer 33 may include a single-crystalline semiconductor layer such as a single-crystalline silicon layer.

Figure 9:
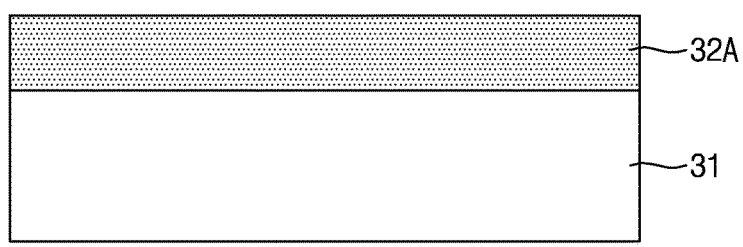
FIGS. 9 and 10 are cross-sectional views for reference in explaining a thin film formation method according to yet another exemplary embodiment of the disclosure.
Figure 10:
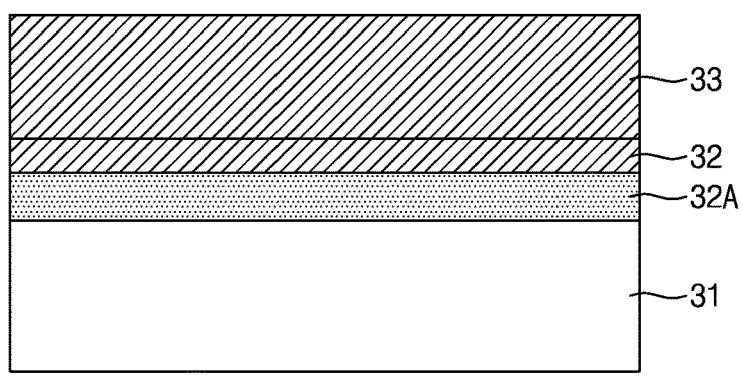

FIGS. 9 and 10 are sectional views for reference in describing yet another example in which less than an entire thickness of the first thin film 32A is reduced.

Referring to FIG. 9, a first thin film 32A may be present on the substrate 31. In an exemplary embodiment, the first thin film 32A may include a silicon oxide film having a thickness of 2 nm or more. Also in an exemplary embodiment, the first thin film 32A may include a silicon oxide layer having a thickness of 2 nm to 10 μm.

Referring to FIG. 10, a reduced semiconductor layer 32 and a semiconductor layer 33 may be formed on the substrate 31 in a manner similar to the manner described with reference to FIGS. 1 to 6. The reduced semiconductor layer 32 may be formed through reduction of a thickness portion of the first thin film 32A. Due to formation of the reduced semiconductor layer 32, the first thin film 32A may be reduced in thickness. The first thin film 32A may be present between the substrate 31 and the reduced semiconductor layer 32. On the first thin film 32A, the reduced semiconductor layer 32 may be continuous with the first thin film 32A. The reduced semiconductor layer 32 and the semiconductor layer 33 may include a poly-semiconductor layer such as a polysilicon layer or an amorphous semiconductor layer such as an amorphous silicon layer.

Figure 11:
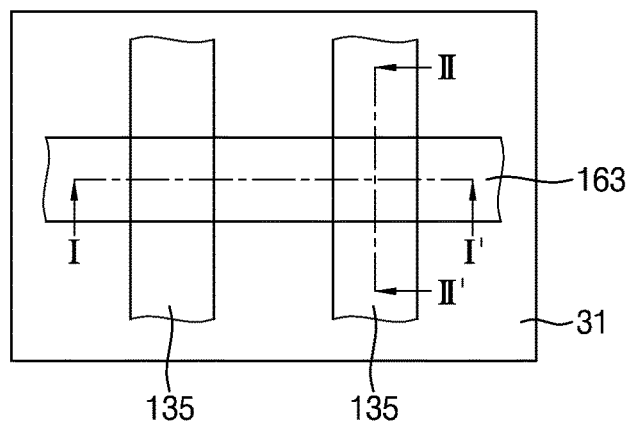
FIG. 11 is a layout view for reference in explaining a thin film formation method according to an exemplary embodiment of the disclosure.
Figure 12:
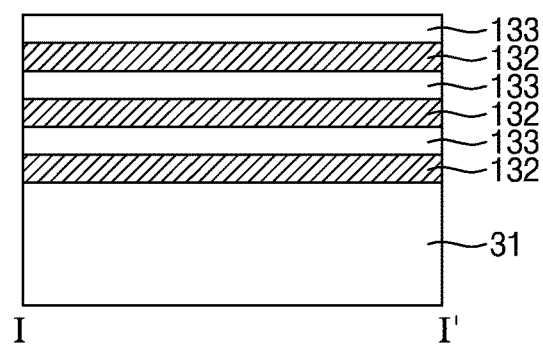
FIGS. 12, 13, 14, 15 and 16 are cross-sectional views for reference in explaining a thin film formation method according to an exemplary embodiment of the disclosure.
Figure 13:
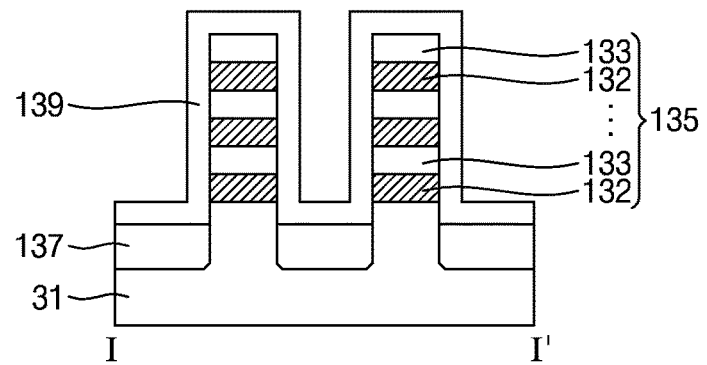
Figure 14:
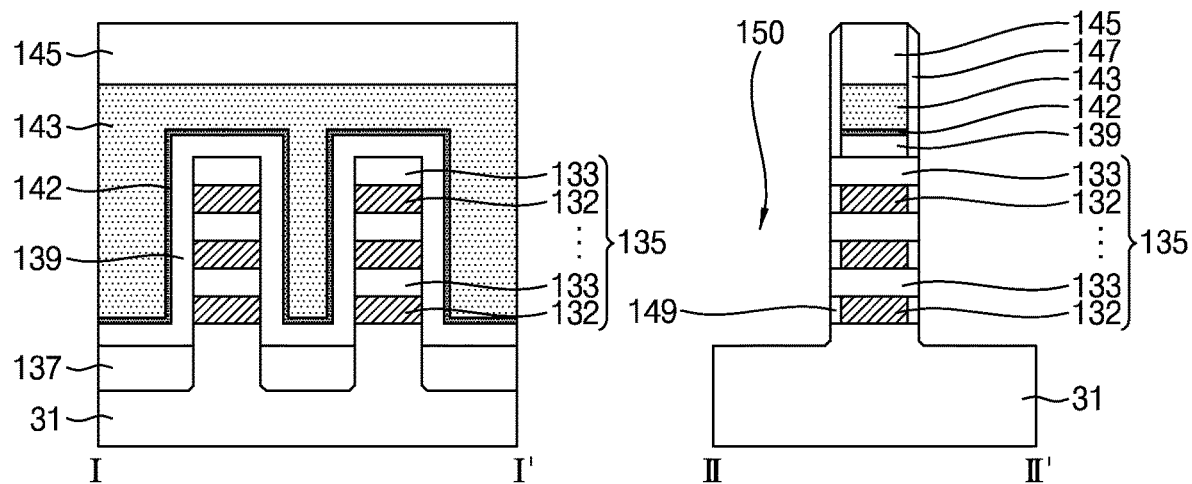
Figure 15:
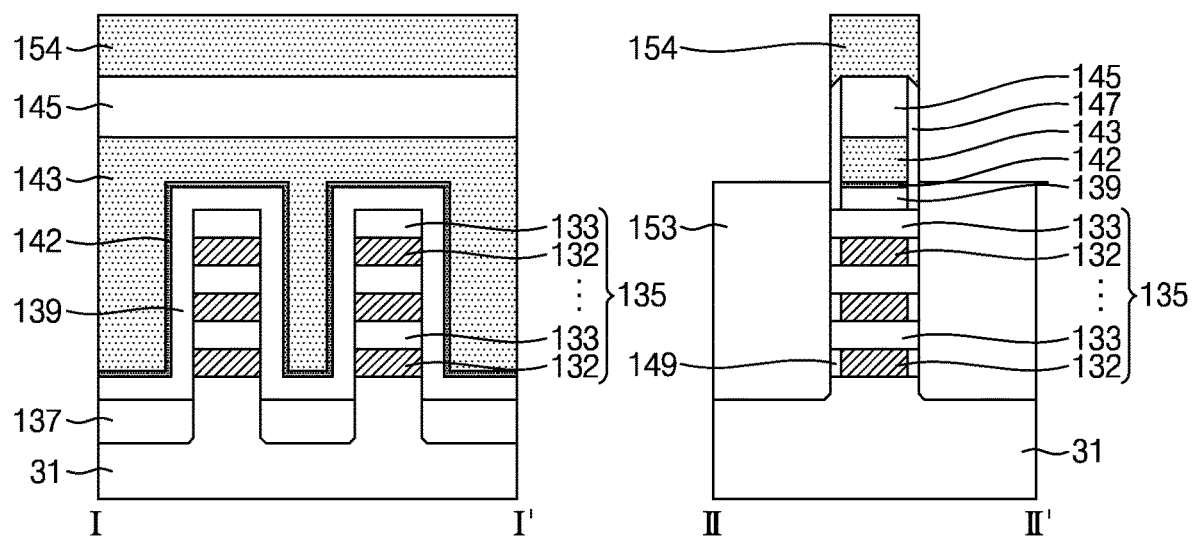
Figure 16:
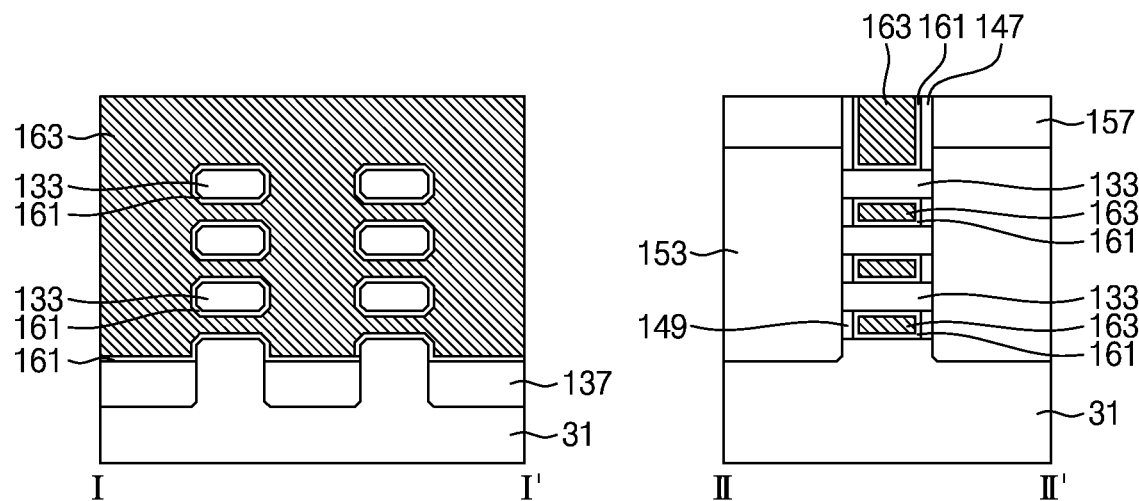

FIG. 11 is a layout view for reference in explaining a thin film formation method according to an exemplary embodiment of the disclosure. FIGS. 12 and 13 are cross-sectional views taken along line I-I' in FIG. 11, for explanation of the thin film formation method. FIGS. 14 to 16 are cross-sectional views taken along lines I-I' and II-II' in FIG. 11, for explanation of the thin film formation method. The thin film formation method according to the exemplary embodiment of the disclosure may be applied to various kinds of semiconductor devices such as a finFET, a multi-bridge channel (MBC) transistor, a gate-all-around (GAA) transistor, a vertical transistor, and/or a planar transistor.

Referring to FIGS. 11 and 12, a plurality of sacrificial layers 132 and a plurality of channel layers 133 may be alternately stacked on a substrate 31. In an exemplary embodiment, the substrate 31 may include a semiconductor substrate such as a single-crystalline silicon wafer. Each sacrificial layer 132 may include a single-crystalline SiGe layer. Each channel layer 133 may include a single-crystalline silicon layer. Each channel layer 133 may be formed in a manner similar to the manner described with reference to FIGS. 1 to 10.

Referring to FIGS. 11 and 13, the plurality of sacrificial layers 132 and the plurality of channel layers 133 may be patterned to form a plurality of fins 135. An element isolation layer 137 may be formed in the substrate 31 between adjacent ones of the plurality of fins 135. A buffer layer 139 may be formed on upper and side surfaces of each fin 135. The element isolation layer 137 may include Si, O, N, C, or a combination thereof. For example, the element isolation layer 137 may include silicon oxide, silicon nitride, silicon oxynitride, low-K dielectrics, high-K dielectrics, or a combination thereof. The buffer layer 139 may include silicon oxide.

Referring to FIGS. 11 and 14, a reduced semiconductor layer 142, temporary gate electrodes 143, and a mask pattern 145 may be formed on the buffer layer 139. Gate spacers 147 may be formed on side surfaces of the reduced semiconductor layer 142, the temporary gate electrodes 143 and the mask pattern 145. A plurality of drain trenches 150 may be formed to be disposed adjacent to opposite sides of respective temporary gate electrodes 143. A plurality of insulating plugs 149 may be formed on side surfaces of the plurality of sacrificial layers 132, respectively.

For formation of the reduced semiconductor layer 142 and the temporary gate electrodes 143, a method similar to the method described with reference to FIGS. 1 to 10 may be applied. A surface of the buffer layer 139 may be partially reduced and, as such, the reduced semiconductor layer 142 may be formed. Using the bias device ("25" in FIG. 1), it may be possible to adjust gap-fill characteristics of the temporary gate electrodes 143. The temporary gate electrodes 143 may exhibit excellent gap-fill characteristics. The reduced semiconductor layer 142 and the temporary gate electrodes 143 may include a poly-semiconductor layer such as a polysilicon layer or an amorphous semiconductor layer such as an amorphous silicon layer. The mask pattern 145 may include silicon oxide or silicon nitride. Each of the gate spacers 147 and the insulating plugs 149 may include an insulating layer including Si, O, N, C, or a combination thereof.

Referring to FIGS. 11 and 15, a plurality of source/drain regions 153 may be formed in the plurality of drain trenches 150, respectively. A dummy layer 154 may be formed on the mask pattern 145.

For formation of the plurality of source/drain regions 153 and the dummy layer 154, a method similar to the method described with reference to FIGS. 1 to 10 may be applied. Each of the source/drain regions 153 may include a single-crystalline semiconductor layer such as a single-crystalline silicon layer. The dummy layer 154 may include a poly-semiconductor layer such as a polysilicon layer or an amorphous semiconductor layer such as an amorphous silicon layer.

Referring to FIGS. 11 and 16, an interlayer insulating layer 157 may be formed on the plurality of source/drain regions 153. After removal of the dummy layer 154, the mask pattern 145, the temporary gate electrodes 143, the reduced semiconductor layer 142, the buffer layer 139, and the plurality of sacrificial layers 132, a gate dielectric layer 161 and a gate electrode 163 may be formed. The gate dielectric layer 161 may include silicon oxide, silicon nitride, silicon oxynitride, high-K dielectrics, or a combination thereof. The gate electrode 163 may include a conductive layer such as metal, metal nitride, metal oxide, metal silicide, conductive carbon, polysilicon, or a combination thereof.

Figure 18:
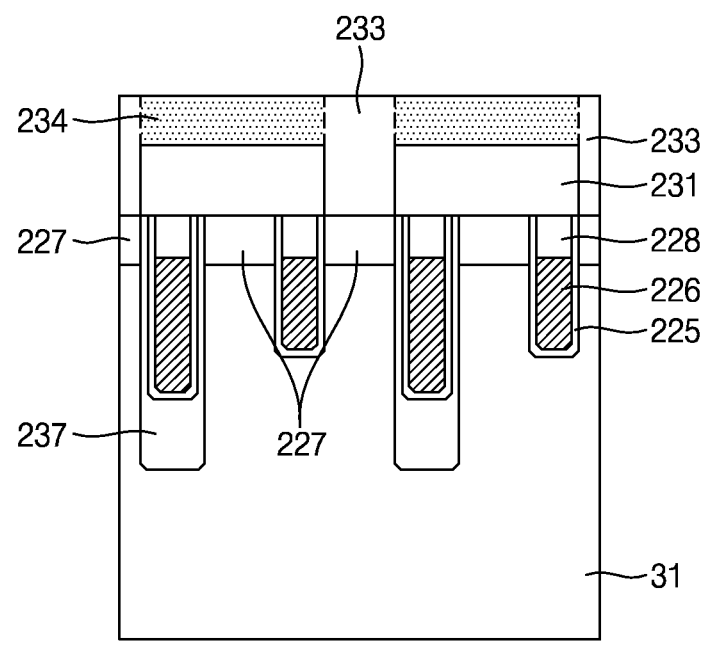
Figure 19:
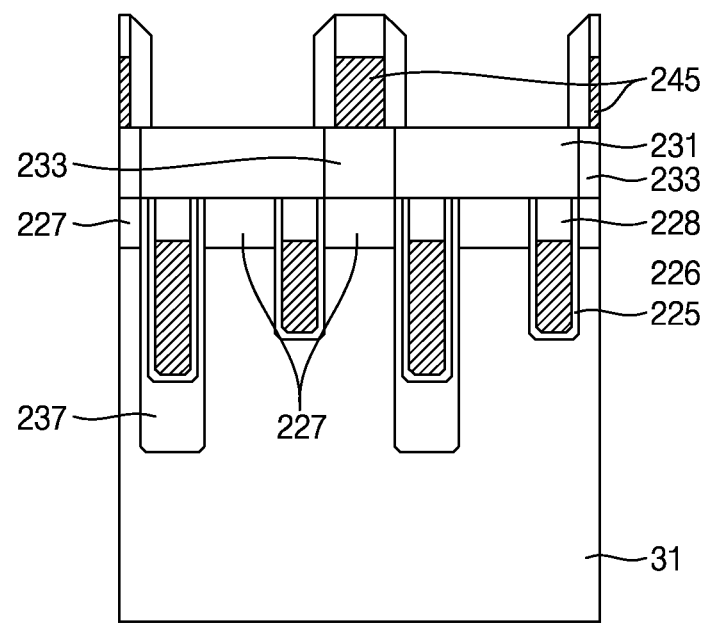
Figure 20:
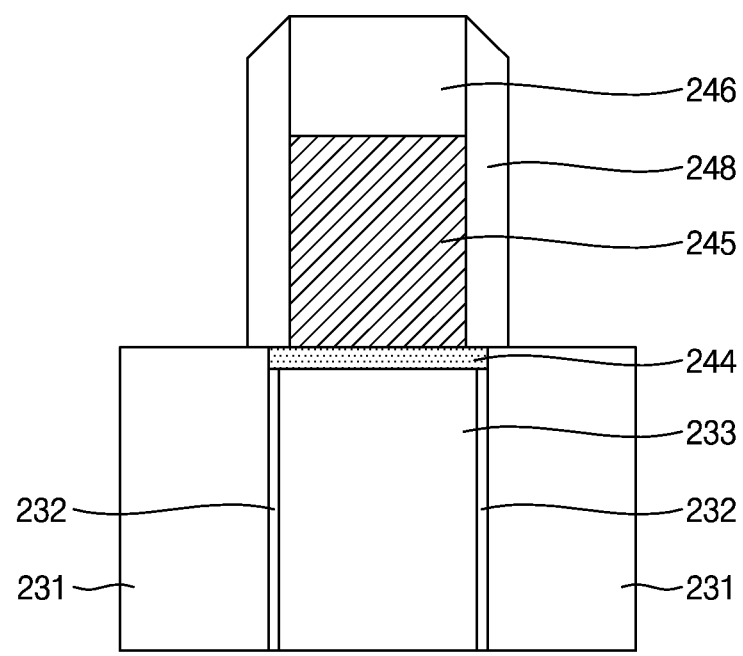
FIG. 20 is an enlarged view of a portion of FIG. 19.

FIGS. 17 to 19 and FIG. 20 are sectional views for reference in explaining a thin film formation method according to an exemplary embodiment of the disclosure. FIG. 20 is an enlarged view showing a portion of FIG. 19. The thin film formation method according to the exemplary embodiment of the disclosure may be applied to various kinds of semiconductor devices such as dynamic random access memory (DRAM).

Figure 17:
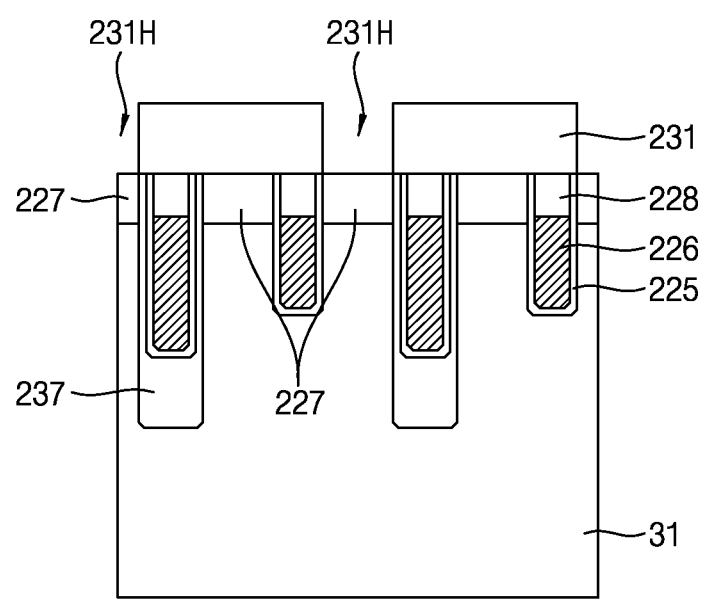
FIGS. 17, 18 and 19 are cross-sectional views for reference in explaining a thin film formation method according to an exemplary embodiment of the disclosure.

Referring to FIG. 17, an element isolation layer 237, a gate dielectric layer 225, gate electrodes 226, source/drain regions 227, a gate capping layer 228, a first insulating layer 231, and contact holes 231H may be formed. The source/drain regions 227 may be exposed at bottoms of the contact holes 231H, respectively. The source/drain regions 227 may include a single-crystalline semiconductor layer such as a single-crystalline silicon layer.

Referring to FIG. 18, a bit contact plug 233 may be formed in each contact hole 231H. A dummy layer 234 may be formed on the first insulating layer 231. For formation of the bit contact plug 233 and the dummy layer 234, a method similar to the method described with reference to FIGS. 1 to 10 may be applied. The bit contact plug 233 may include a single-crystalline semiconductor layer such as a single-crystalline silicon layer. The dummy layer 234 may include a poly-semiconductor layer such as a polysilicon layer or an amorphous semiconductor layer such as an amorphous silicon layer.

Referring to FIG. 19, the dummy layer 234 may be removed, and bit lines 245 may then be formed on the first insulating layer 231. The bit lines 245 may contact the bit contact plugs 233, respectively. The bit lines 245 may include a conductive layer such as metal, metal nitride, metal oxide, metal silicide, conductive carbon, polysilicon, or a combination thereof.

Referring to FIG. 20, the first insulating layer 131 may include silicon oxide. A reduced semiconductor layer 232 may be formed to surround a side surface of each bit contact plug 233. The reduced semiconductor layer 232 may be interposed between the first insulating layer 131 and the bit contact plug 233. For formation of the reduced semiconductor layer 232 and the bit contact plug 233, a method similar to the method described with reference to FIGS. 1 to 10 may be applied. The reduced semiconductor layer 232 may include a single-crystalline semiconductor layer such as a single-crystalline silicon layer. A metal silicide layer 244 may be formed between the bit contact plug 233 and the bit line 245 corresponding thereto. A bit capping layer 246 may be formed on each bit line 245. Bit spacers 248 may be formed on side surfaces of each bit line 245, respectively.

Figure 21:
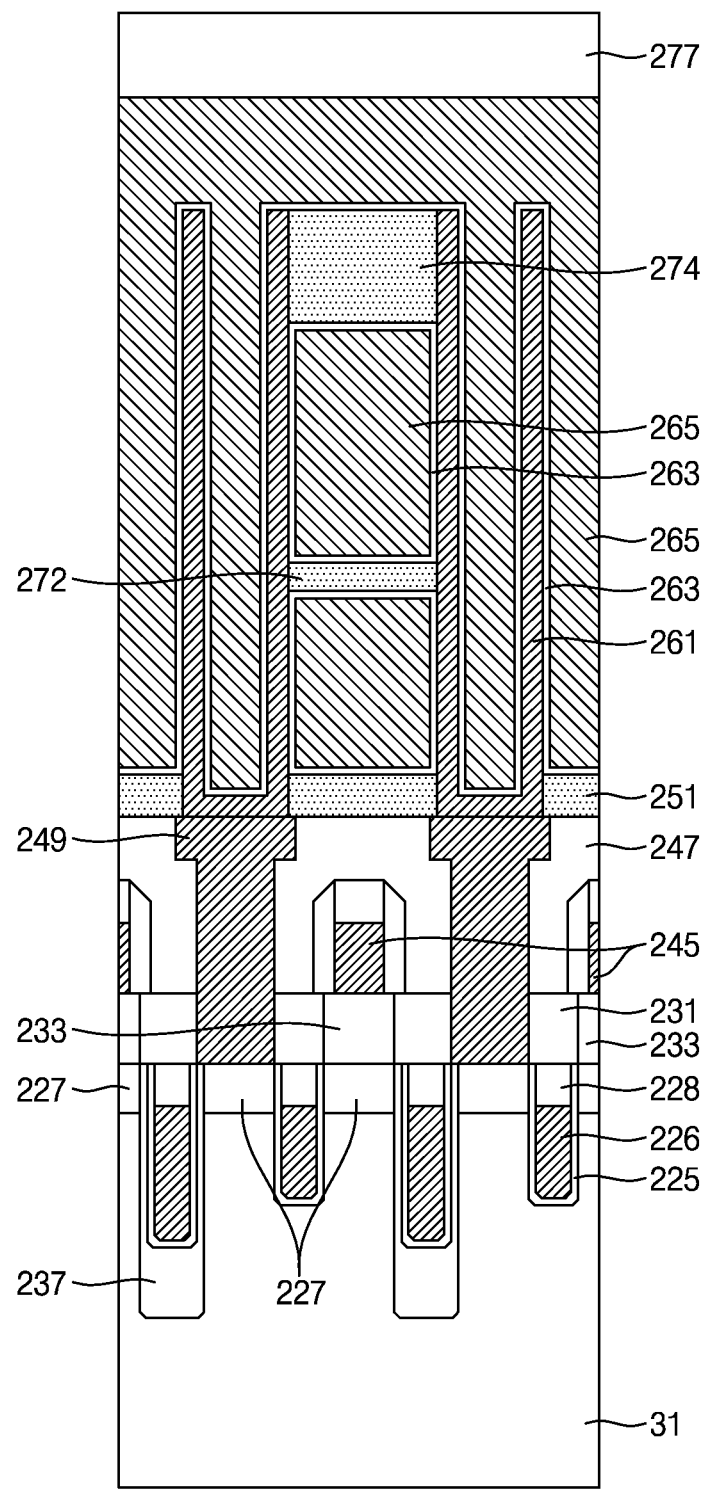
FIG. 21 is an additional cross-sectional view for reference in explaining a thin film formation method according to an exemplary embodiment of the disclosure

Referring to FIG. 21, a second insulating layer 247 may be formed on the first insulating layer 131 to cover the bit lines 245. Buried contact plugs 249 may be formed in the second insulating layer 247. An etch stop layer 251, first electrodes 261, a capacitor dielectric layer 263, second electrodes 265, first supports 272, second supports 274, and a third insulating layer 277 may be selectively formed on the second insulating layer 247 and the buried contact plugs 249.

Each first electrode 261 may extend through the etch stop layer 251 to contact a corresponding one of the buried contact plugs 249. Each first support 272 and each second support 274 may contact side surfaces of corresponding ones of the first electrodes 261. Each second electrode 265 may be formed on a corresponding one of the first electrodes 261. The capacitor dielectric layer 263 may be formed between each first electrode 261 and each second electrode 265, between each first support 272 and each second electrode 265 and between each second support 274 and each second electrode 265. Each first electrode 261, the capacitor dielectric layer 263 and each second electrode 265 may constitute a cell capacitor. Each first electrode 261 may include various kinds of three-dimensional shapes such as a cylindrical shape, a pillar shape, or a combination thereof.

Figure 22:
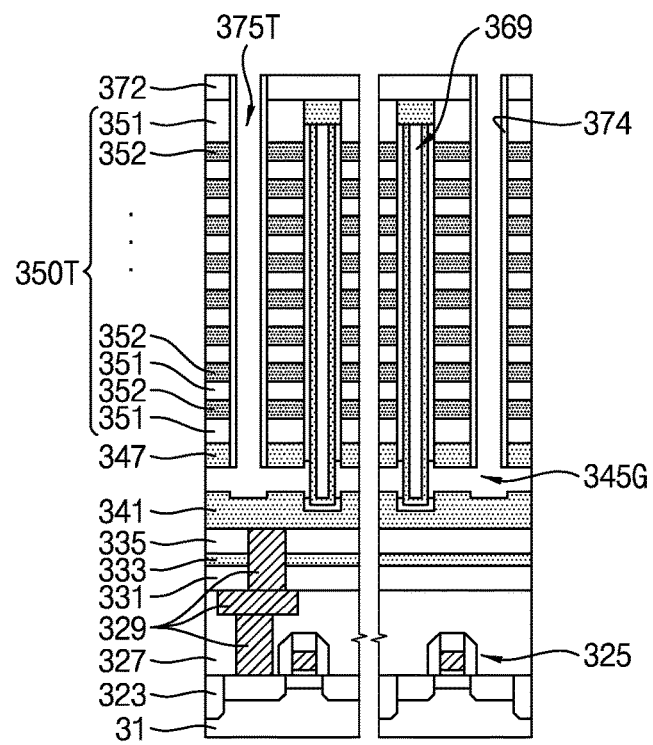
FIGS. 22 and 23 are cross-sectional views for reference in explaining a thin film formation method according to an exemplary embodiment of the disclosure.
Figure 23:
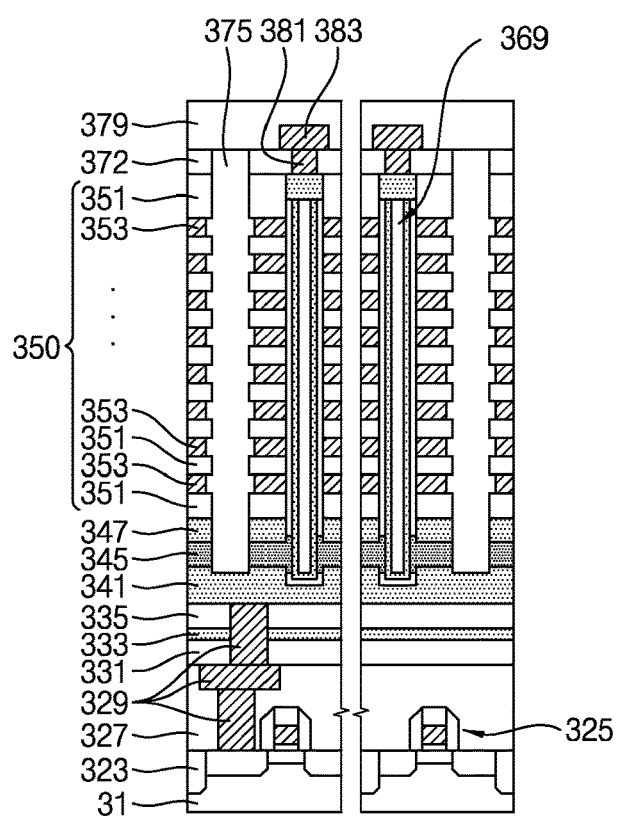
Figure 24:
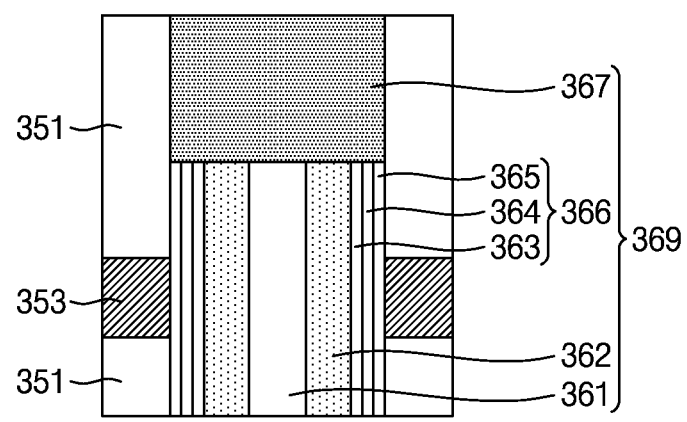
FIG. 24 is an enlarged view of a portion of FIG. 23.

FIGS. 22 and 23 are sectional views for reference in explaining a thin film formation method according to an exemplary embodiment of the disclosure. FIG. 24 is an enlarged view showing a portion of FIG. 23. The thin film formation method according to the exemplary embodiment of the disclosure may be applied to various kinds of non-volatile memory devices such as VNAND.

Referring to FIG. 22, an element isolation layer 323, a plurality of transistors 325, a first insulating layer 327, a plurality of peripheral circuit wirings 329, a second insulating layer 331, a third insulating layer 333, a fourth insulating layer 335, a horizontal conductive layer 341, a gap region 345G, a support 347, a temporary stack structure 350T, a plurality of cell channel structures 369, a fifth insulating layer 372, a plurality of isolation trenches 375T, and a plurality of sacrificial spacers 374 may be formed on a substrate 31. The temporary stack structure 350T may include a plurality of insulating layers 351 and a plurality of sacrificial layers 352 which are alternately stacked.

The gap region 345G may be formed between the horizontal conductive layer 341 and the support 347. The gap region 345G may communicate with the plurality of isolation trenches 375T. The horizontal conductive layer 341 may correspond to a source line or a common source line (CSL). The horizontal conductive layer 341 may include a conductive layer such as metal, metal nitride, metal oxide, metal silicide, conductive carbon, polysilicon, or a combination thereof. For example, the horizontal conductive layer 341 may include polysilicon.

Referring to FIG. 23, a connecting conductive layer 345 may be formed in the gap region 345G. For formation of the connecting conductive layer 345 in the gap region 345G, a method similar to the method described with reference to FIGS. 1 to 10 may be applied. The connecting conductive layer 345 may include a poly-semiconductor layer such as a polysilicon layer or an amorphous semiconductor layer such as an amorphous silicon layer.

The plurality of sacrificial spacers 374 may be removed. After removal of the sacrificial spacers 374, a plurality of electrode layers 353 may be formed. The plurality of insulating layers 351 and the plurality of electrode layers 353 may constitute a stack structure 350.

A plurality of isolation patterns 375 may be formed in respective isolation trenches 375T. A plurality of bit plugs 381 may be formed in the fifth insulating layer 372. A sixth insulating layer 379 and a plurality of bit lines 383 may be formed on the fifth insulating layer 372.

Referring to FIG. 24, each cell channel structure 369 may include a core pattern 361, a channel layer 362 surrounding an outside of the core pattern 361, an information storage pattern 366 surrounding an outside of the channel layer 362, and a bit pad 367. The information storage pattern 366 may include a tunnel insulating layer 363 surrounding the outside of the channel layer 362, a charge storage layer 364 surrounding an outside of the tunnel insulating layer 363, and a blocking layer 365 surrounding an outside of the charge storage layer 364.

In an exemplary embodiment, the connecting conductive layer 345 may extend through a side surface of the information storage pattern 366 to directly contact a side surface of the channel layer 362.

In accordance with exemplary embodiments of the disclosure, thin film formation apparatus and methods are provided which enable the low-temperature deposition of a single-crystalline semiconductor layer on a substrate without first executing a cleaning process for removal of a thin film such as silicon oxide located at the substrate.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A thin film formation method comprising:
   loading a substrate having a thin film onto a platen within a chamber such that the thin film faces toward a target within the chamber;
   supplying an inert gas and a reducing gas comprising hydrogen (H2) or deuterium (D2) into the chamber through a gas inlet of the chamber; and
   generating, using a microwave plasma source, plasma within the chamber that: (1) removes oxygen from a thin film, which is disposed on the substrate, to convert at least a portion of the thin film to a reduced semiconductor layer containing no oxygen or substantially no oxygen, (2) forms a semiconductor layer on the reduced semiconductor layer, and (3) creates a continuous single-crystalline semiconductor layer comprising the reduced semiconductor layer and the semiconductor layer.

2. The method according to claim 1, further comprising heating the substrate to a temperature in a range of 100 to 500° C., both inclusive.

3. The method according to claim 2, wherein the microwave plasma source is a 2.45 GHz microwave plasma device.

4. The method according to claim 3, wherein generating the plasma includes supplying an electric power of 500 to 5,000 W, both inclusive.

5. The method according to claim 1, wherein the thin film comprises a silicon oxide layer having a thickness of 0.1 to 2 nm.

6. The method according to claim 1, wherein the continuous single-crystalline semiconductor layer comprises the substrate, the reduced semiconductor layer, and the semiconductor layer.

7. The method of claim 1, wherein the substrate includes silicon and the thin film includes silicon and oxygen.

8. A thin film formation method comprising:
   loading a substrate having a thin film onto a platen within a chamber such that a surface of the substrate faces toward a target within the chamber;
   supplying in inert gas and a reducing gas comprising hydrogen (H2) or deuterium (D2) into the chamber through a gas inlet of the chamber; and
   generating, using a microwave plasma source, plasma within the chamber that: (1) removes oxygen from a thin film, which is disposed on the substrate, to convert at least a portion of the thin film to a reduced semiconductor layer containing no oxygen or substantially no oxygen, (2) forms a semiconductor layer over the reduced semiconductor layer, and (3) creates a continuous single-crystalline semiconductor layer comprising the reduced semiconductor layer and the semiconductor layer.

9. The method of claim 8, wherein the thin film is an oxide film at the surface of the substrate.

10. The method according to claim 8, further comprising heating the substrate to a temperature in a range of 100 to 500° C., both inclusive.

11. The method according to claim 8, wherein the microwave plasma source is a 2.45 GHz microwave plasma device.

12. The method according to claim 8, wherein generating the plasma includes supplying an electric power of 500 to 5,000 W, both inclusive.

13. The method according to claim 8, wherein the thin film comprises a silicon oxide layer having a thickness of 0.1 to 2 nm.

14. The method according to claim 8, wherein the continuous single-crystalline semiconductor layer comprises the substrate, the reduced semiconductor layer, and the semiconductor layer.

15. The method of claim 8, wherein the substrate includes silicon and the thin film includes silicon and oxygen.

* * * * *